(12) United States Patent
Ochi et al.

(10) Patent No.: US 11,776,785 B2
(45) Date of Patent: Oct. 3, 2023

(54) FIELD EMISSION DEVICE AND FIELD EMISSION METHOD

(71) Applicant: MEIDENSHA CORPORATION, Tokyo (JP)

(72) Inventors: Hayato Ochi, Numazu (JP); Rena Takahashi, Numazu (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 18/007,860

(22) PCT Filed: May 26, 2021

(86) PCT No.: PCT/JP2021/019936
§ 371 (c)(1),
(2) Date: Dec. 2, 2022

(87) PCT Pub. No.: WO2021/246253
PCT Pub. Date: Dec. 9, 2021

(65) Prior Publication Data
US 2023/0197394 A1 Jun. 22, 2023

(30) Foreign Application Priority Data
Jun. 5, 2020 (JP) ................. 2020-098124

(51) Int. Cl.
*H01J 35/06* (2006.01)
*H01J 35/16* (2006.01)
*H01J 37/32* (2006.01)

(52) U.S. Cl.
CPC ............ *H01J 35/065* (2013.01); *H01J 35/16* (2013.01); *H01J 37/32532* (2013.01)

(58) Field of Classification Search
CPC ................................... H01J 35/065
See application file for complete search history.

(56) References Cited

U.S. PATENT DOCUMENTS

| 10,068,741 B2 | 9/2018 | Takahashi et al. |
| 10,424,457 B2 | 9/2019 | Takahashi et al. |
| 10,607,801 B2 | 3/2020 | Takahashi et al. |

(Continued)

FOREIGN PATENT DOCUMENTS

| JP | 2004-235121 A | 8/2004 |
| JP | 4408891 B2 | 2/2010 |

(Continued)

*Primary Examiner* — Chih-Cheng Kao
(74) *Attorney, Agent, or Firm* — Foley & Lardner LLP

(57) ABSTRACT

A vacuum container is configured so that an opening on one side and an opening on another side in the longitudinal direction of a cylindrical insulating body are sealed with an emitter unit and a target unit respectively; and a vacuum chamber is provided on the inner peripheral side of the insulating body. The emitter unit is provided with: a moving body located on the one side in the longitudinal direction in the vacuum chamber and supported so as to be movable in the longitudinal direction via a bellows; and a guard electrode located on the outer peripheral side of the moving body. An emitter section having an electron generating section is formed at a tip section of the moving body on the other side in the longitudinal direction by subjecting the surface of the tip section to film formation processing.

5 Claims, 7 Drawing Sheets

(56) References Cited

U.S. PATENT DOCUMENTS

| | | | |
|---|---|---|---|
| 10,651,001 B2 | 5/2020 | Takahashi et al. | |
| 2010/0002840 A1* | 1/2010 | Jaafar | H01J 35/065 |
| | | | 250/515.1 |
| 2013/0234582 A1* | 9/2013 | Ishiguro | H01J 19/54 |
| | | | 313/310 |
| 2017/0365439 A1* | 12/2017 | Takahashi | H01J 35/16 |

FOREIGN PATENT DOCUMENTS

| | | |
|---|---|---|
| JP | 6135827 B2 | 5/2017 |
| JP | 2017-224399 A | 12/2017 |
| JP | 2017-228444 A | 12/2017 |
| JP | 2017-228471 A | 12/2017 |
| KR | 1020160058582 | 5/2016 |
| WO | WO-2016/104484 A1 | 6/2016 |

\* cited by examiner

FIELD EMISSION DEVICE AND FIELD EMISSION METHOD

CROSS-REFERENCE TO RELATED APPLICATIONS

The present application is a U.S. national stage entry of International Application No. PCT/JP2021/019936 filed May 26, 2021, which claims priority to Japanese Application No. 2020-098124 filed Jun. 5, 2020, the entire contents of each of which are incorporated herein by reference.

TECHNICAL FIELD

The present invention relates to a field emission device and a field emission method applicable to various devices such as X-ray devices, electron tubes, and lighting devices.

BACKGROUND ART

As an example, a field emission device applicable to various devices such as X-ray devices, electron tubes, and lighting devices may include a vacuum container including a tubular insulator having first and second ends both sealed to form a vacuum chamber inside the insulator.

The vacuum chamber contains an emitter (i.e., an electron source employing carbon etc.) and a target that are respectively disposed in a first end side and a second end side in a direction of the first and second ends of the insulator (hereinafter simply referred to as a both-end direction). The emitter is structured to emit an electron beam due to electric field emission (i.e., generation and emission of electrons) therein, in response to application of a voltage between the emitter and the target. Then, the emitted electron beam collides with the target. This achieves intended functions: for example, an X-ray device emits an X-ray outwardly and thereby achieves an intended radioscopic resolution.

Such field emission device as described above is under examination for reducing dispersal of the electron beam emitted from the emitter, by, for example, employing a triode structure with a grid electrode disposed between the emitter and the target, forming a surface of an electron generator (i.e., a part facing the target and generating electrons) of the emitter as a curved surface, disposing around the emitter a guard electrode equal to the emitter in electric potential, etc.

Upon the voltage application as described above, it is desirable to emit the electron beam by emitting electrons from only the electron generator of the emitter. However, such desirable operation may be disturbed due to insufficiency in withstand voltage caused by unintended flashover, in case that the vacuum chamber contains undesired objects such as minute projections and dirt.

Specifically, such disturbance occurs when: the guard electrode (which may be the target, the grid electrode, the guard electrode, etc., but is simply explained as the guard electrode in the following) inside the vacuum chamber includes a part being likely to cause local concentration of electric field, such as a minute projection formed during processing; the guard electrode contains gas components adhering thereto, such as residual gas components inside the vacuum chamber; and/or the guard electrode includes as a material thereof an element that tends to generate electrons. These situations may cause the guard electrode to include another electron generation part, and destabilize an amount of generation of electrons, and facilitate dispersal of the electron beam. For example, the above situations may cause an X-ray device to undergo X-ray focus deviation.

In view of the foregoing, field emission devices are under examination for suppressing the flashover and stabilizing the electron generation amount by applying voltage discharge conditioning to a guard electrode. The voltage discharge conditioning is treatment for reforming or regeneration (hereinafter simply referred to as reforming treatment) that is specifically performed by applying a voltage such as a high one to a guard electrode etc. (e.g., a guard electrode and a grid electrode) and then repeating electric discharge.

For example, Patent Document 1 discloses a field emission device in which an emitter (see reference numeral 3 in FIG. 1) is mounted to a movable body (see reference numeral 4 in FIG. 1) being supported by a bellows member (see reference numeral 43 in FIG. 1) movably in a both-end direction of a vacuum chamber.

Patent Document 1 describes separating the emitter from a guard electrode by operating the movable body to move in the both-end direction after installing various components (e.g., the vacuum chamber, the movable body, the emitter, and the guard electrode) of the field emission device. Patent Document 1 argues that this suppresses electric discharge from the emitter (in other words, brings the emitter into a discharge suppression state) and facilitates implementation of an intended reforming treatment.

Patent Document 1 further describes operating the movable body again after the reforming treatment and then bringing the emitter close to the guard electrode so as to allow the emitter (in detail, an electron generator) to perform electric field emission (in other words, bring the emitter into a discharge allowance state).

Patent Document 2 discloses a method for forming an electron generator in an emitter by applying film formation processing to a substrate of the emitter with a material such as a carbon (e.g., carbon nanotubes).

PRIOR ART DOCUMENT(S)

Patent Document(s)

Patent Document 1: JP 6135827 B2
Patent Document 2: JP 4408891 B2

SUMMARY OF THE INVENTION

A field emission device often includes various tolerances such as tolerances in dimension of components and errors in assembly (hereinafter simply referred to as tolerances). Such tolerances may cause a problem in operation of a movable body to which an emitter is mounted as described above. Specifically, the tolerances may cause a trouble such as axis misalignment between the emitter and a guard electrode, and may prevent an electron generator of the emitter from appropriately approaching or contacting with the guard electrode when operating the movable body after a reforming treatment and thereby moving the emitter from a position of the discharge suppression state to a position of the discharge allowance state. This may result in failure in intended field emission from the emitter (the electron generator).

In view of the foregoing technical problem, it is desirable to provide an art for facilitating intended approach or contact between an electron generator of an emitter and a guard electrode and thereby facilitating intended field emission.

The present invention provides a field emission device and a field emission method that serve to solve the above problem. According to one aspect, a field emission device includes: a vacuum container including an insulator shaped tubular and a vacuum chamber formed inside the insulator, wherein the insulator includes first and second ends both sealed; a bellows member expandable in a both-end direction that is a direction of the first and second ends; a movable body disposed in a first end side in the both-end direction in the vacuum chamber, and supported by the bellows member so as to be movable in the both-end direction; a guard electrode disposed around the movable body; and a target disposed in a second end side in the both-end direction in the vacuum chamber so as to face a second face of the movable body that is a face directed toward the second end side in the both-end direction, wherein: the movable body includes an emitter formed in a tip of the second face of the movable body; and the emitter is formed by applying film formation processing to a surface of the tip, and includes an electron generator.

The field emission device may be further configured such that: the movable body includes an outer periphery including an outer peripheral stepped part that has a diameter decreasing from the first end side toward the second end side in the both-end direction so as to form a step; the guard electrode includes an inner periphery including an inner peripheral stepped part that has a diameter decreasing from the first end side toward the second end side in the both-end direction so as to form a step; and the outer peripheral stepped part and the inner peripheral stepped part overlap with each other when viewed in the both-end direction, and are structured to contact with each other in response to satisfaction of a condition that the electron generator of the emitter and the guard electrode are close to or in contact with each other.

The field emission device may be further configured such that: the bellows member is shaped tubular, and is coaxial with the movable body, and includes a pair of ends out of which one is supported by the first end of the vacuum container and the other supports the movable body; the vacuum container includes a movable body operation hole extending in the both-end direction through an end of the vacuum container in the first end side in the both-end direction, wherein the movable body operation hole is disposed in an inner circumferential side with respect to the bellows member and is coaxial with the movable body; the movable body includes a first face facing the first end side in the both-end direction and including a shaft extending coaxially with the movable body in a direction from the second end side toward the first end side in the both-end direction; and the shaft extends through the movable body operation hole, and is movable in the both-end direction.

The field emission device may be further configured such that the guard electrode includes a second end section facing the second end side in the both-end direction, and includes a reduced-diameter section disposed in the second end section of the guard electrode and structured such that the electron generator of the emitter approaches and separates from the reduced-diameter section due to movement of the movable body in the both-end direction.

The field emission device may be further configured such that the guard electrode includes a second end section facing the second end side in the both-end direction, and includes a brim disposed in the second end section of the guard electrode and formed to spread toward an axis of the movable body and overlap with a periphery of the electron generator of the emitter when viewed in the both-end direction.

According to one aspect, a field emission method with use of the field emission device above includes: setting an output of a field emission current by: moving the movable body in the both-end direction to change a distance between the electron generator of the emitter and the target; and fixing the movable body at a position to set the distance as intended; and emitting electric field from the electron generator of the emitter, with the movable body fixed at the position.

The above aspects of the present invention serves to facilitate intended approach or contact between an electron generator of an emitter and a guard electrode, and thereby facilitate intended field emission.

BRIEF DESCRIPTION OF THE DRAWINGS

FIG. 2A shows a discharge allowance state. FIG. 2B shows a discharge suppression state.

FIG. 4A shows a state in which guard electrode 5 and emitter 43 are close to each other. FIG. 4B shows a state in which guard electrode 5 and emitter 43 are in press-contact with each other.

FIG. 6A shows a state without axis misalignment. FIG. 6B shows a state with axis misalignment.

MODE(S) FOR CARRYING OUT THE INVENTION

Each embodiment of the present invention shows a field emission device and a field emission method totally different from those according to configurations as disclosed in Patent Document 1 (hereinafter referred to as conventional configurations) that presents simply mounting an emitter to a movable body movably supported by a bellows member in a first end side in a both-end direction of a vacuum chamber: hereinafter, such movable body is simply referred to as a movable body.

Each of the present embodiments employs a movable body with an emitter formed in the movable body itself by film formation processing. Specifically, the movable body includes a tip facing a second end side in a both-end direction wherein the tip includes a surface in which the emitter including an electron generator is formed.

Figure 6:
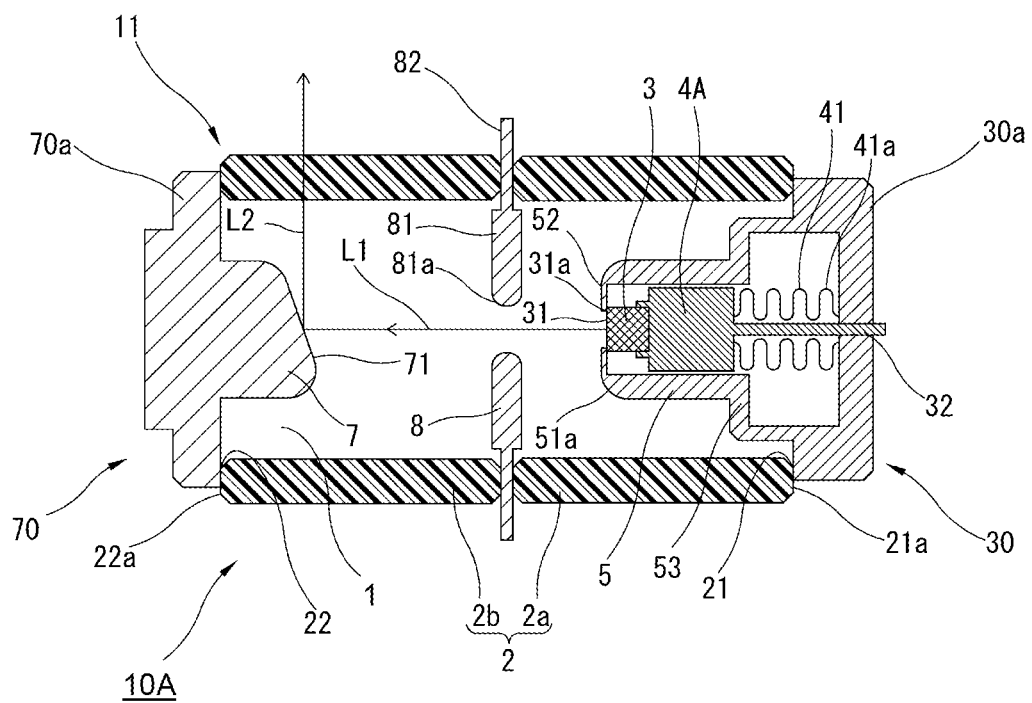
FIG. 6 is a schematic configuration view for explanation of a general field emission device 10A, which is a longitudinal sectional view of the field emission device 10A in the direction of the both ends of vacuum chamber 1.
Figure 7A:
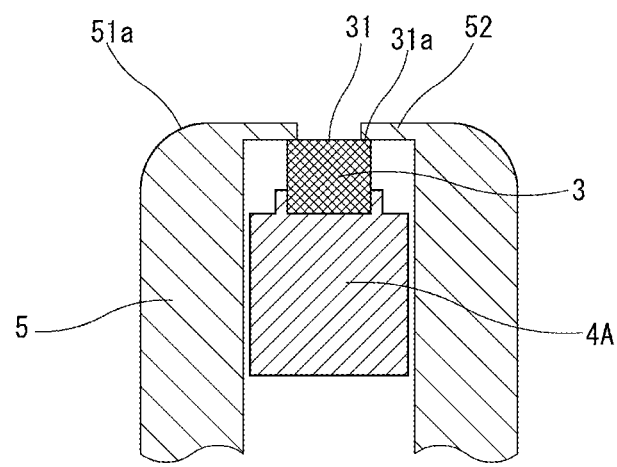
FIGS. 7A and 7B are schematic configuration views for explanation of emitter unit 30 shown in FIG. 6, which are enlarged views a part of FIG. 6.
Figure 7B:
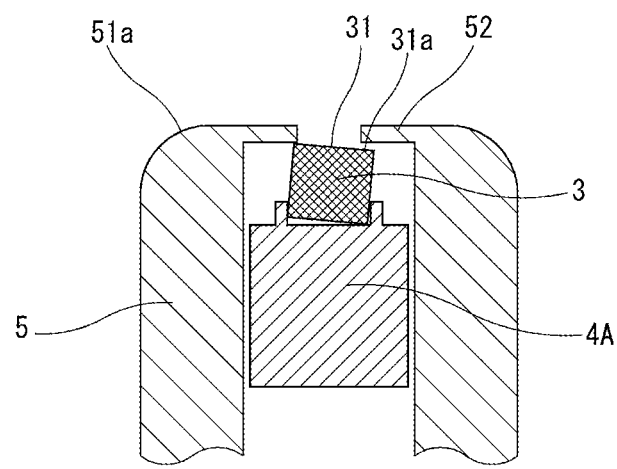

The conventional configurations present a field emission device like a field emission device 10A shown in FIGS. 6, 7A, and 7B that includes an emitter 3 mounted to a movable body 4A movably supported by a bellows member 41 in a first end side in a both-end direction of a vacuum chamber 1 of a vacuum container 11.

As shown in FIG. 7A, field emission device 10A is structured to change a distance between emitter 3 and a guard electrode 5 by moving movable body 4A in the both-end direction. However, as shown in FIG. 7B, field emission device 10A may undergo axis misalignment between emitter 3 and movable body 4A due to a tolerance in components. Such axis misalignment may result in failure in appropriately maintaining emitter 3 and movable body 4A close to or in contact with each other and then failure in performing intended field emission from emitter 3 (in detail, from an electron generator 31). Furthermore, the axis misalignment disturbs uniformity of electric field on a surface of emitter 3, and may shorten a life of emitter 3 in case of occurrence of local field emission.

On the other hand, each of the present embodiments forms the emitter in the movable body itself, and thereby eliminates necessity for a mounting process of the emitter required in the conventional configurations. This configuration of forming the emitter in the movable body itself serves to suppress the movable body from undergoing the axis misalignment. Accordingly, each of the present embodiments serves to bring the emitter and a guard electrode into a predetermined adjacent state (i.e., a state in which the emitter and the guard electrode are close to or in contact with each other) as intended, by appropriately moving the movable body in a both-end direction. This facilitates intended field emission.

Each of the present embodiments employs the emitter formed in the movable body itself by film formation processing as described above, and may be modified as appropriate with reference to Patent Document 1 and/or common technical knowledges in various fields such as a field of field emission devices and a field of carbon nanotubes, as long as configured to allow change in distance between the emitter and the guard electrode. This is exemplified by the first and second embodiments below.

The first and second embodiments below (and FIGS. 6, 7A, and 7B) represent common components etc. by same reference signs, and thereby omit detailed explanation as appropriate. Furthermore, for convenience of explanation, a direction of first and second ends of vacuum container 11 described below is simply referred to as a both-end direction, wherein a side of the first end in the both-end direction is referred to as a both-end first side, and a side of the second end in the both-end direction is referred to as a both-end second side.

First Embodiment

Figure 1:
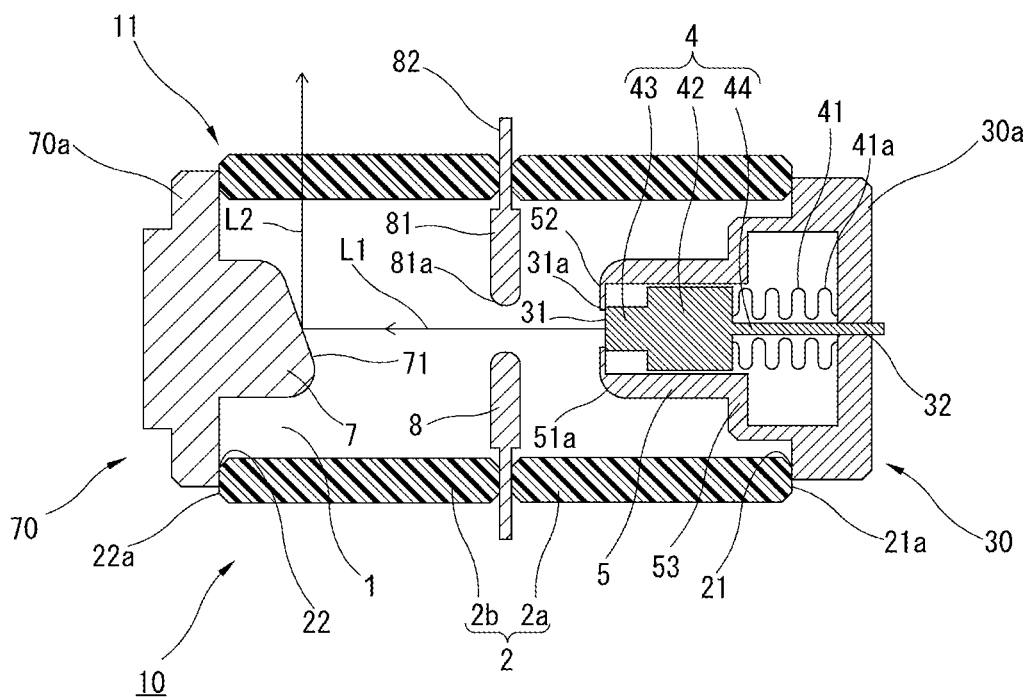
FIG. 1 is a schematic configuration view for explanation of an X-ray device 10 according to a first embodiment, which is a longitudinal sectional view of the X-ray device 10 in a direction of both ends of a vacuum chamber 1.
Figure 2A:
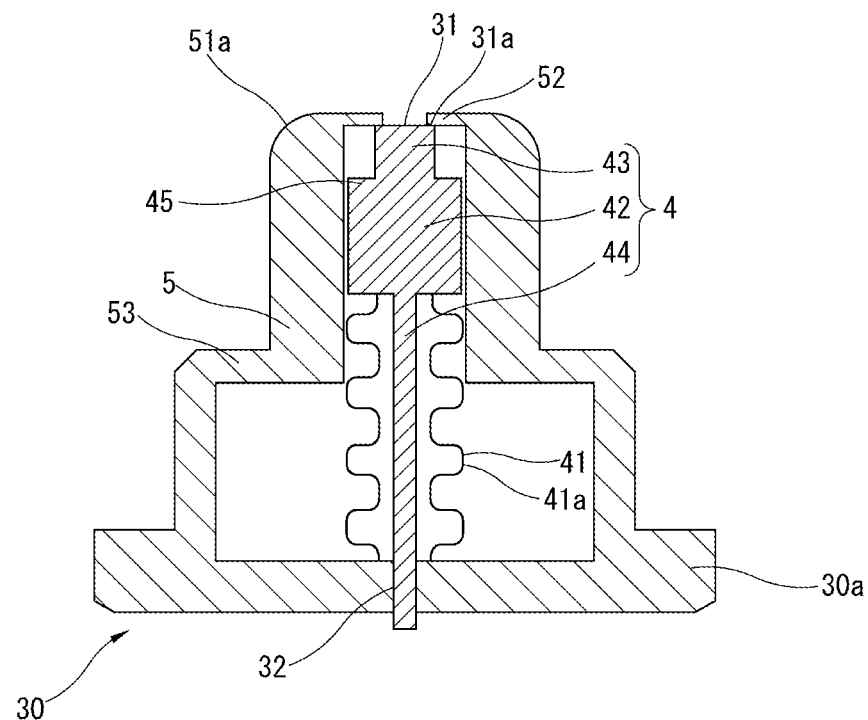
FIGS. 2A and 2B are schematic configuration views for explanation of an emitter unit 30 shown in FIG. 1, which are enlarged views a part of FIG. 1.
Figure 2B:
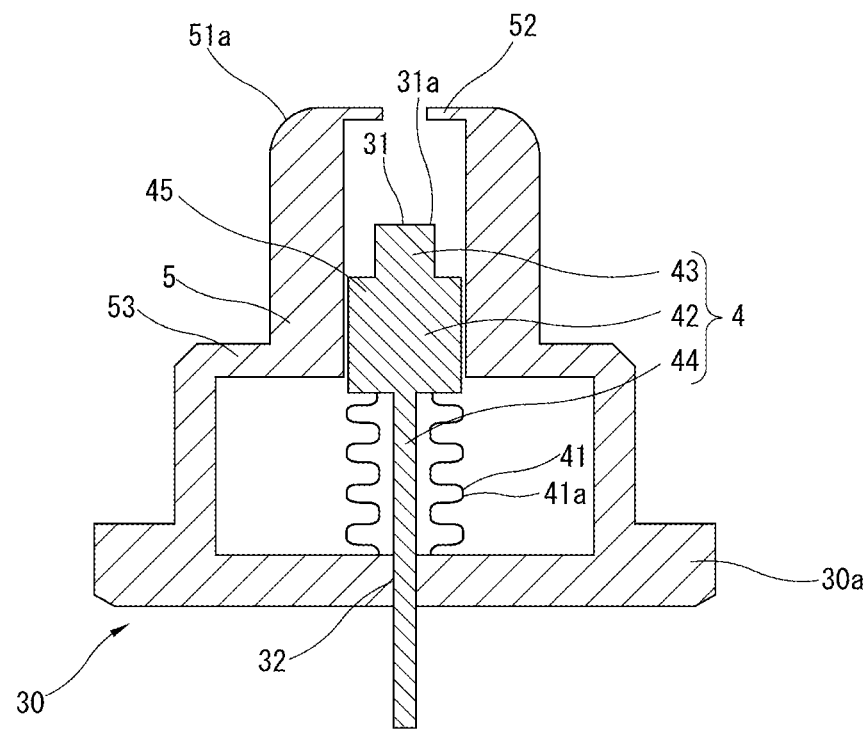

<Configurations of X-ray Device 10> Reference numeral 10 in FIGS. 1, 2A, and 2B represents an X-ray device according to the first embodiment, for explanation of schematic configurations of the X-ray device. X-ray device 10 includes a vacuum container 11 including an insulator 2 and a vacuum container 11 formed inside insulator 2. Insulator 2 has a tubular shape, and includes an opening 21 facing the both-end first side and an opening 22 facing the both-end second side. Opening 21 is sealed with an emitter unit 30 (for example, by brazing). Opening 22 is sealed with a target unit 70.

X-ray device 10 includes a grid electrode 8 between emitter unit 30 and target unit 70 (i.e., between an emitter section 43 and a target 7 described below). Grid electrode 8 extends in a cross sectional direction with respect to vacuum chamber 1 that is a direction intersectional to the both-end direction of vacuum container 11.

Insulator 2 forms vacuum chamber 1 inside it, and is made of an insulating material such as a ceramic so as to establish insulation between emitter unit 30 and target unit 70 (i.e., between emitter 3 and target 7 described below). Insulator 2 may be variously configured as long as satisfying the above conditions. For example, as shown in the drawings, insulator 2 may be composed of a pair of insulation members 2a and 2b that are shaped tubular, and are coaxially arranged in an axial direction thereof, and are joined to each other by brazing while interposing grid electrode 8 (in detail, a lead terminal 82 described below) therebetween.

Emitter unit 30 includes a flange 30a, a movable body 4, and a guard electrode 5. Flange 30a is supported by an end face 21a of opening 21 of insulator 2, and seals opening 21. Movable body 4 is disposed in vacuum chamber 1 adjacently to the first end in the both-end direction, and is supported by a bellows member 41 movably in the both-end direction. Guard electrode 5 is disposed to surround an outer periphery of movable body 4.

Movable body 4 is formed by molding a material available for movable body 4 or by machining (e.g., cutting, polishing, etc.) a lump of the material. Movable body 4 includes a main body 42 and a shaft 44 in addition to emitter 43 mentioned above. Main body 42 has a columnar shape. Emitter 43 is formed in a second face of main body 42 facing the both-end second side (i.e., formed in a tip of movable body 4 directed to the both-end second side). Shaft 44 is formed in a first face of main body 42 facing the both-end first side.

Emitter 43 is less in diameter than main body 42, and movable body 4 includes an outer peripheral stepped part 45 between main body 42 and emitter 43. Outer peripheral stepped part 45 is shaped to decrease in diameter as going in a direction from the both-end first side toward the both-end second side so as to form a step.

Emitter 43 includes a surface facing the both-end second side wherein the surface is processed by film formation processing to form an electron generator 31 in the surface. Electron generator 31 may be variously configured as long as being an emitting body structured to generate electrons in response to voltage application and emit an electron beam L1 as shown in the drawings.

For example, electron generator 31 may be formed by film formation processing (e.g., one disclosed in Patent Document 2) with a material such as a carbon (e.g., carbon nanotubes) wherein the material is deposited as a thin film in the surface of emitter 43 by vapor deposition. Emitter 43 in FIGS. 4A and 4B described below is drawn such that electron generator 31 is formed by depositing a considerable number of carbon nanotubes in emitter 43 by vapor deposition.

Electron generator 31 desirably includes a surface facing target unit 70 (in detail, target 7) and being a convex curved surface. This facilitates focusing of electron beam L1.

Shaft 44 extends along an axis of movable body 4 in a direction from the both-end second side toward the both-end first side, and is inserted in a movable body operation hole 32 such that a tip of shaft 44 toward the both-end first side pierces movable body operation hole 32. This allows shaft 44 to be movable in the both-end direction.

The material available for movable body 4 is not limited to a specific one as long as being shapable to an intended shape by molding, machining, etc. For example, the material may be a conductive metal such as a stainless steel (i.e., a SUS material) or a copper.

Bellows member 41 has a tubular shape greater in diameter than shaft 44 of movable body 4, and is disposed to extend coaxially with movable body 4 (e.g., extend to surround an outer periphery of shaft 44 as shown in the drawings), and is expandable in the both-end direction. Furthermore, bellows member 41 includes a pair of ends out of which one faces the both-end first side and is supported by flange 30a, and the other faces the both-end second side and supports main body 42.

Bellows member 41 serves as a partition between vacuum chamber 1 and an atmosphere (i.e., an outside of vacuum container 11), and thereby maintains vacuum chamber 1 gastight, in spite of existence of movable body operation hole 32 described below. Furthermore, bellows member 41 supports movable body 4, and allows movable body 4 to move in the both-end direction. In the drawings, movable body 4 is operated by moving shaft 44 in the both-end direction.

Bellows member 41 may be variously configured as long as being expandable as described above, and may be formed, for example, by appropriately processing a thin plate metal. The drawings exemplarily show bellows member 41 including a bellows tubular wall 41a extending in the both-end direction to surround the outer periphery of shaft 44.

Guard electrode 5 is disposed around movable body 4, especially around electron generator 31 of emitter 43. Guard electrode 5 may be variously configured as long as structured to suppress dispersal of electron beam L1 when guard electrode 5 and emitter 43 are in the predetermined adjacent state (e.g., a state shown in FIG. 1) as a result of contact and separation between guard electrode 5 and electron generator 31 due to movement of movable body 4.

For example, guard electrode 5 may be made of a material such as a stainless steel (i.e., a SUS material), and have a tubular shape extending in the both-end direction so as to surround an outer periphery of emitter 43, and include a pair of ends out of which one faces the both-end first side and surrounds an outer periphery of bellows member 41 in a vicinity of flange 30a, and the other faces the both-end second side (i.e., faces target 7) and contacts with and separates from emitter 43. Furthermore, guard electrode 5 in the drawings is shaped to decrease in diameter as going in the direction from the both-end first side to the both-end second side so as to form a step 53.

Figure 3:
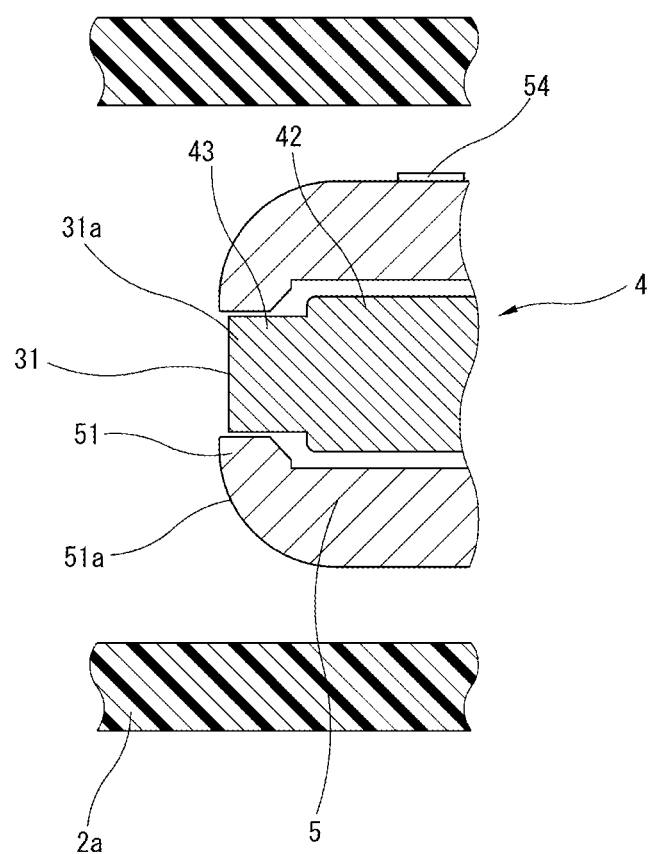
FIG. 3 is a schematic configuration view for explanation of an example of a guard electrode 5, which is an enlarged view of a part of FIG. 1 and shows guard electrode 5 including a reduced-diameter section 51 instead of a brim 52.

The configuration of guard electrode 5 regarding contact with and separation from emitter 43 is not limited to a specific one. Guard electrode 5 may include a brim 52 spreading toward the axis of movable body 4 and overlapping with a periphery 31a of electron generator 31 of emitter 43 when viewed in the both-end direction as shown in FIGS. 1, 2A, and 2B, or may include a reduced-diameter section 51 in the end of guard electrode 5 facing the both-end second side as shown in FIG. 3. Otherwise, guard electrode 5 may include both of brim 52 and reduced-diameter section 51 (not shown in the drawings).

In case of guard electrode 5 configured as described above regarding the contact and separation, the movement of movable body 4 causes emitter 43 to move in the both-end direction within a tubular internal space of guard electrode 5, and thereby causes electron generator 31 of emitter 43 to contact with and separate from brim 52 or reduced-diameter section 51. Furthermore, in case of guard electrode 5 including brim 52, brim 52 covers and protects periphery 31a of electron generator 31 when guard electrode 5 and emitter 43 are in the predetermined adjacent state.

In addition to the above, periphery 31a of electron generator 31 may be increased in apparent radius of curvature in order to suppress local concentration of electric field on electron generator 31 (especially on periphery 31a) and suppress flashover from electron generator 31 to other components. For example, as shown in the drawings, guard electrode 5 may include a curved part 51a shaped convex, in the end of guard electrode 5 facing the both-end second side.

In case of FIG. 3, guard electrode 5 includes a getter 54 mounted to an outer periphery of guard electrode 5 by welding etc. Getter 54 is not limited in mounting position and in material.

Flange 30a includes movable body operation hole 32 extending through flange 30a in the both-end direction at a position in an inner circumferential side with respect to bellows member 41 and being coaxial with movable body 4. Movable body operation hole 32 receives shaft 44 inserted thereinto from the tip of shaft 44, so as to allow shaft 44 to move in the both-end direction.

This configuration of shaft 44 extending through movable body operation hole 32 allows an operator to grip and move the tip of shaft 44 (i.e., the tip projecting outside vacuum container 11) in the both-end direction and thereby appropriately change the distance between movable body 4 (in detail, electron generator 31 of emitter 43) and target 7 described below.

Target unit 70 includes the target 7 and a flange 70a. Target 7 faces electron generator 31 of emitter 43. Flange 70a is supported by an end face 22a of opening 22 of insulator 2, and seals opening 22.

Target 7 may be variously configured as long as structured to receive electron beam L1 emitted from electron generator 31 of emitter 43 and emit an X-ray L2 as shown in the drawings. Target 7 in the drawings includes a part facing electron generator 31 wherein the part includes a slope 71 spreading in a sectional direction inclined at a predetermined angle with respect to electron beam L1. Thus, electron beam L1 collides with slope 71. This causes X-ray L2 to be irradiated in a direction angled with respect to an irradiation direction of electron beam L1. For example, X-ray L2 is irradiated in the cross sectional direction with respect to vacuum chamber 1.

Grid electrode 8 may be variously configured as long as disposed between emitter 43 and target 7 as described above and structured to appropriately control electron beam L1 passing through grid electrode 8. For example, as shown in the drawings, grid electrode 8 may include an electrode 81 (e.g., a mesh electrode) and a lead terminal 82, wherein: electrode 81 extends in the cross sectional direction with respect to vacuum chamber 1, and includes a passage hole 81a through which electron beam L1 passes; and lead terminal 82 extends through insulator 2 in the cross sectional direction with respect to vacuum chamber 1.

X-ray device 10 configured as described above is structured to change the distance between electron generator 31 of emitter 43 and target 7 by appropriately moving movable body 4, and thereby switch emitter 43 between the discharge suppression state and the discharge allowance state.

<Example of Reforming Treatment on Guard Electrode and Field Emission in X-ray Device 10> At first upon a reforming treatment of guard electrode 5 etc. in X-ray device 10, emitter 43 is brought into the discharge suppression state. This is performed by appropriately holding the tip of shaft 44 extending through movable body operation hole 32 to operate shaft 44 and move movable body 4 in the direction toward the both-end first side, and thereby, as shown in FIG. 2B, separating electron generator 31 of emitter 43 from brim 52 (or reduced-diameter section 51 in case of FIG. 3) of guard electrode 5: these operations may be performed by an operator etc.

In the state as shown in FIG. 2B, the reforming treatment of guard electrode 5 etc. (e.g., melt-smoothing of a surface of guard electrode 5) can be performed by applying an intended reforming voltage to a section such as one between guard electrode 5 and grid electrode 8 (lead terminal 82) or one between target 7 and grid electrode 8, and thereby causing repetitive electric discharge from guard electrode 5 etc.

Upon electric field emission after the reforming treatment, electron generator 31 of emitter 43 and brim 52 of guard electrode 5 are brought into the predetermined adjacent state as shown in FIG. 2A, by operating shaft 44 again and thereby moving movable body 4 in the direction toward the both-end second side. This serves to suppress dispersal of electron beam L1 emitted from electron generator 31.

In the state as shown in FIG. 2A, electron generator 31 of emitter 43 and guard electrode 5 are equal to each other in electric potential, and electron beam L1 can be emitted by applying an intended voltage to a section such as one between emitter 43 and target 7, and thereby causing generation of electrons from electron generator 31. Then, electron beam L1 collides with target 7, and causes target 7 to emit X-ray L2.

The first embodiment described above allows shaft 44 to be appropriately operated to move movable body 4 in the both-end direction and thereby serves to perform the reforming treatment as intended, while suppressing guard electrode 5 from causing the flashover (i.e., generation of electrons) and thereby serving to stabilize X-ray device 10 in electron generation amount. Furthermore, the first embodiment allows electron beam L1 to be a focused electron flux, and thereby facilitates convergence of a focus of X-ray L2 and improves X-ray device 10 in radioscopic resolution.

The configuration of forming emitter 43 with electron generator 31 in movable body 4 itself prevents the axis misalignment as in the conventional configurations, and facilitates the operation for bringing emitter 43 and guard electrode 5 into the predetermined adjacent state as intended.

This allows movable body 4 to be appropriately moved in the both-end direction and fixed at a position to set the distance between electron generator 31 of emitter 43 and target 7 as intended, and allows X-ray irradiation to be performed as intended with movable body 4 fixed at the position.

Second Embodiment

X-ray device 10 is structured to bring electron generator 31 of emitter 43 and guard electrode 5 into the predetermined adjacent state as intended, by setting an appropriate travel distance of movable body 4 in the both-end direction. However, this operation may face a difficulty in confirming whether electron generator 31 and guard electrode 5 are actually in the predetermined adjacent state, because the inside of X-ray device 10 is invisible. In other words, it may be difficult to appropriately set the travel distance of movable body 4 in the both-end direction.

Figure 4A:
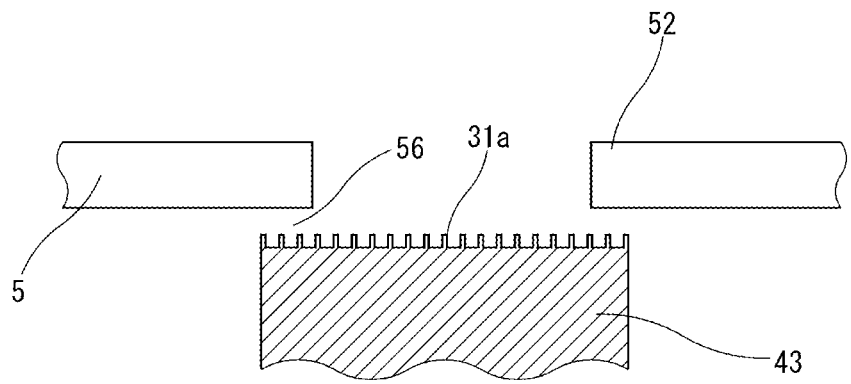
FIGS. 4A and 4B are schematic configuration views for explanation of contact and separation between guard electrode 5 and an emitter 43.
Figure 4B:
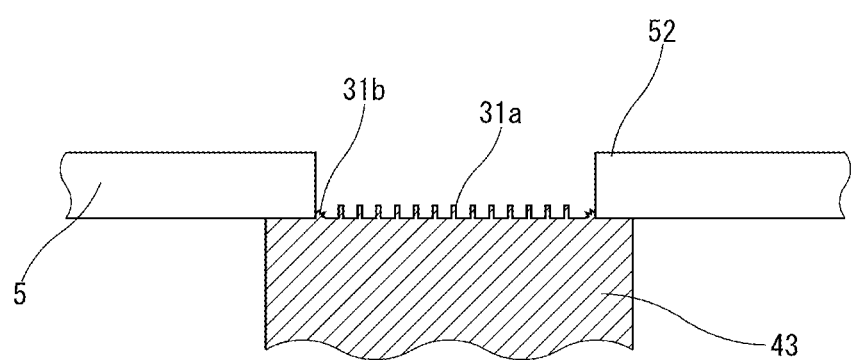

In case of guard electrode 5 including brim 52 as shown in FIGS. 4A and 4B, the above difficulty may cause movable body 4 to excessively travel in the direction toward the both-end second side, and thereby cause electron generator 31 to press-contact with brim 52 and be damaged as shown in FIG. 4B. In FIG. 4B, reference numeral 31b represents a damaged portion of electron generator 31.

In view of the foregoing, the second embodiment is configured to facilitate appropriate setting of the travel distance of movable body 4 in the both-end direction, by regulating travel of movable body 4 in the direction toward the both-end second side as follows.

Figure 5:
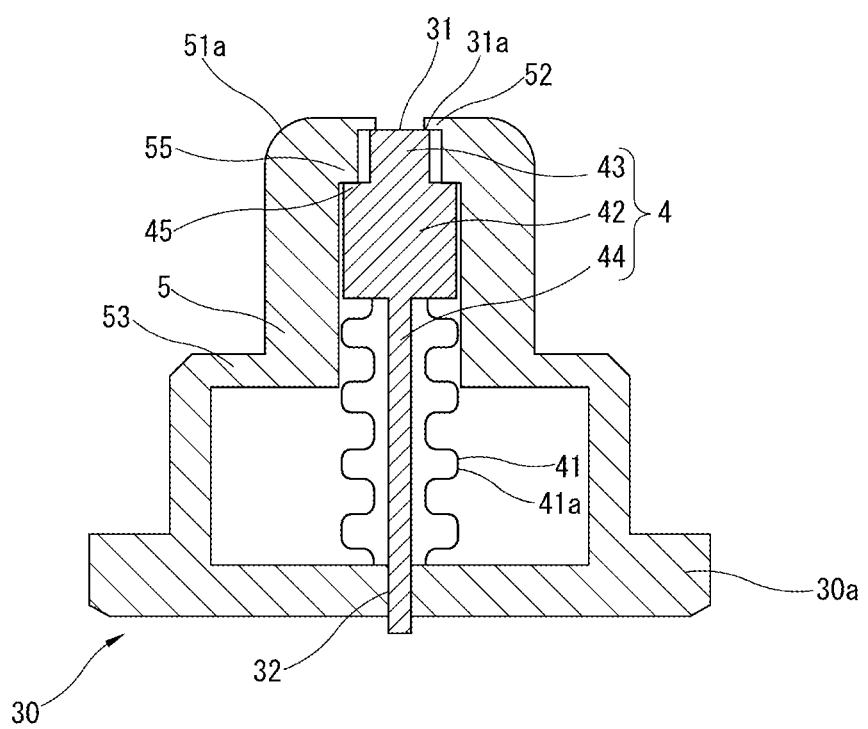
FIG. 5 is a schematic configuration view for explanation of how to regulate movement of a movable body 4 according to a second embodiment, which is an enlarged view of a part of FIG. 1 and shows the discharge allowance state.

<Configurations for Travel Regulation of Movable Body 4> Guard electrode 5 of X-ray device 10 shown in FIG. 5 includes an inner peripheral stepped part 55 disposed in an inner periphery of guard electrode 5 midway in the both-end direction and shaped to decrease in diameter in the direction from the both-end first side toward the both-end second side to form a step. Accordingly, guard electrode 5 includes a first part greater in diameter than a second part where: the first part is a part facing the both-end first side with respect to inner peripheral stepped part 55; and the second part is a part facing the both-end second side with respect to inner peripheral stepped part 55.

Inner peripheral stepped part 55 of guard electrode 5 overlaps with outer peripheral stepped part 45 of movable body 4 when viewed in the both-end direction. Inner peripheral stepped part 55 and outer peripheral stepped part 45 are structured such that electron generator 31 of emitter 43 and guard electrode 5 are in the predetermined adjacent state as shown in FIG. 4A when inner peripheral stepped part 55 and outer peripheral stepped part 45 are in contact (e.g., surface-to-surface contact) with each other. In case of the predetermined adjacent state shown in FIG. 4A or 5, electron generator 31 of emitter 43 and brim 52 of guard electrode 5 have a gap 56 therebetween.

The second embodiment described above has the following effects in addition to the effects same with the first embodiment. In response to satisfaction of a condition that movable body 4 travels due to operation of shaft 44 until outer peripheral stepped part 45 contacts with inner peripheral stepped part 55, the travel of movable body 4 in the direction toward the both-end second side is regulated as shown in FIG. 4A, and electron generator 31 and guard electrode 5 are deemed to be in the predetermined adjacent state.

Thus, the second embodiment facilitates confirming the predetermined adjacent state, and facilitates appropriate setting of the travel distance of movable body 4 in the both-end direction.

Inner peripheral stepped part 55 and outer peripheral stepped part 45 may be variously configured as long as structured to be in contact with each other when electron generator 31 of emitter 43 and guard electrode 5 are in the predetermined adjacent state. For example, inner peripheral stepped part 55 and outer peripheral stepped part 45 may be configured such that each of them spreads in the cross sectional direction along a contact plane therebetween.

The above description details only the picked embodiments of the present invention. The configurations described therein may be variously modified within scope of technical ideas of the present invention, as is obvious to a person skilled in the art. Also such modifications naturally belong to scope of the present claims.

For example, X-ray device 10 may be modified to further include a guide member for guidance of movable body 4 in the both-end direction, such as a guide rail not shown extending in the both-end direction along an outer periphery of movable body 4.

Furthermore, the effects of the first and second embodiments may be achieved also by appropriately modifying the contents disclosed in Patent Document 1 etc.

The invention claimed is:

1. A field emission device comprising:
a vacuum container including an insulator shaped tubular and a vacuum chamber formed inside the insulator, wherein the insulator includes first and second ends both sealed;
a bellows member expandable in a both-end direction that is a direction of the first and second ends;
a movable body disposed in a first end side in the both-end direction in the vacuum chamber, and supported by the bellows member so as to be movable in the both-end direction;
a guard electrode disposed around the movable body; and
a target disposed in a second end side in the both-end direction in the vacuum chamber so as to face a second face of the movable body that is a face directed toward the second end side in the both-end direction,
wherein:
the movable body includes an emitter formed in a tip of the second face of the movable body;
the emitter is formed by applying film formation processing to a surface of the tip, and includes an electron generator;
the movable body includes an outer periphery including an outer peripheral stepped part that has a diameter decreasing from the first end side toward the second end side in the both-end direction so as to form a step;
the guard electrode includes an inner periphery including an inner peripheral stepped part that has a diameter decreasing from the first end side toward the second end side in the both-end direction so as to form a step; and
the outer peripheral stepped part and the inner peripheral stepped part overlap with each other when viewed in the both-end direction, and are structured to come into surface-to-surface contact with each other in response to satisfaction of a condition that the electron generator of the emitter and the guard electrode are close to or in contact with each other.

2. The field emission device as claimed in claim 1, wherein:
the bellows member is shaped tubular, and is coaxial with the movable body, and includes a pair of ends out of which one is supported by the first end of the vacuum container and the other supports the movable body;
the vacuum container includes a movable body operation hole extending in the both-end direction through an end of the vacuum container in the first end side in the both-end direction, wherein the movable body operation hole is disposed in an inner circumferential side with respect to the bellows member and is coaxial with the movable body;
the movable body includes a first face facing the first end side in the both-end direction and including a shaft extending coaxially with the movable body in a direction from the second end side toward the first end side in the both-end direction; and
the shaft extends through the movable body operation hole, and is movable in the both-end direction.

3. The field emission device as claimed in claim 1, wherein the guard electrode includes a second end section facing the second end side in the both-end direction, and includes a reduced-diameter section disposed in the second end section of the guard electrode and structured such that the electron generator of the emitter approaches and separates from the reduced-diameter section due to movement of the movable body in the both-end direction.

4. The field emission device as claimed in claim 1, wherein the guard electrode includes a second end section facing the second end side in the both-end direction, and includes a brim disposed in the second end section of the guard electrode and formed to spread toward an axis of the movable body and overlap with a periphery of the electron generator of the emitter when viewed in the both-end direction.

5. A field emission method with use of the field emission device as claimed in claim 1, the field emission method comprising:
setting an output of a field emission current by: moving the movable body in the both-end direction to change a distance between the electron generator of the emitter and the target; and fixing the movable body at a position to set the distance as intended; and
emitting electric field from the electron generator of the emitter, with the movable body fixed at the position.

* * * * *